United States Patent [19]

McLeod

[11] 3,956,093

[45] May 11, 1976

[54] PLANAR MAGNETRON SPUTTERING METHOD AND APPARATUS

[75] Inventor: Paul S. McLeod, Berkeley, Calif.

[73] Assignee: Airco, Inc., Montvale, N.J.

[22] Filed: Dec. 16, 1974

[21] Appl. No.: 532,806

[52] U.S. Cl. .............................. 204/192; 204/298
[51] Int. Cl.² ...................................... C23C 15/00
[58] Field of Search ............................ 204/192, 298

[56] References Cited
UNITED STATES PATENTS

| | | | |
|---|---|---|---|
| 3,736,246 | 5/1973 | Grasenick | 204/192 |
| 3,878,085 | 4/1975 | Corbani | 204/298 |

OTHER PUBLICATIONS

J. S. Chapin, "The Planar Magnetron," Vacuum Technology, Jan. 1974, pp. 37–38, 40.

*Primary Examiner*—John H. Mack
*Assistant Examiner*—Aaron Weisstuch
*Attorney, Agent, or Firm*—David A. Draegert; Edmund W. Bopp; H. Hume Mathews

[57] ABSTRACT

A planar magnetron sputtering apparatus is provided with an additional, variable magnetic field normal to and substantially throughout the erosion region of a cathode plate. Application of the foregoing variable magnetic field effects continuous variations in the general location of the points at which magnetic lines of flux are parallel to the cathode plate which correspondingly results in variations in the points of maximum cathode plate erosion. By producing a less acute erosion pattern over a wider cathode plate area, a greater portion of the cathode plate material may be sputtered from any particular planar cathode plate.

10 Claims, 4 Drawing Figures

FIG. 2
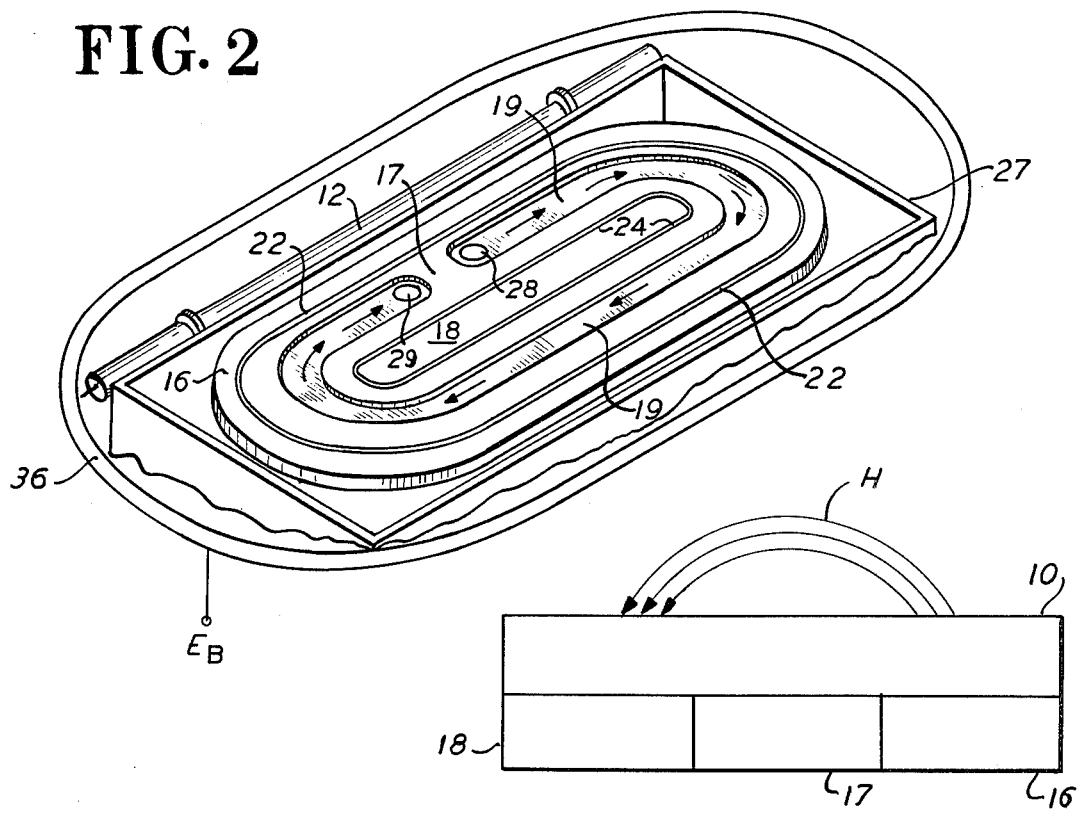
FIG. 3
*PRIOR ART*
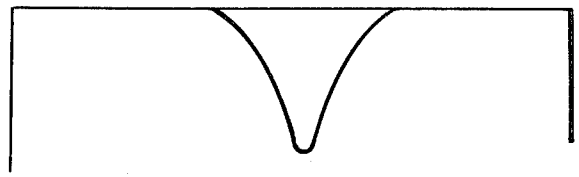
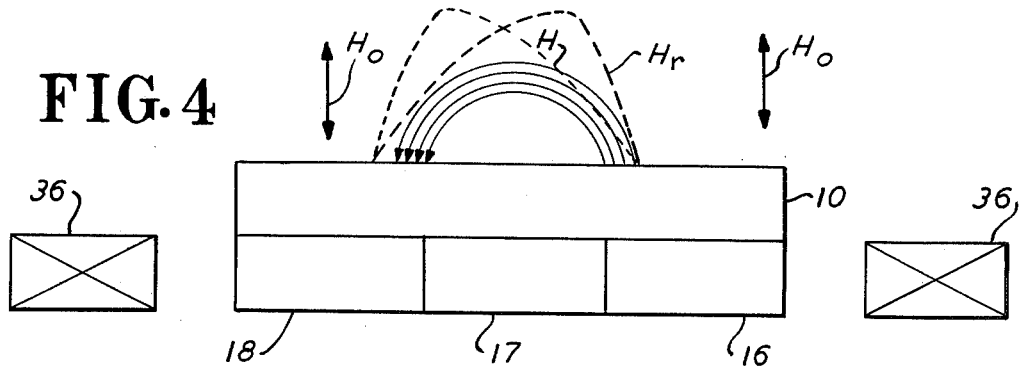
FIG. 4
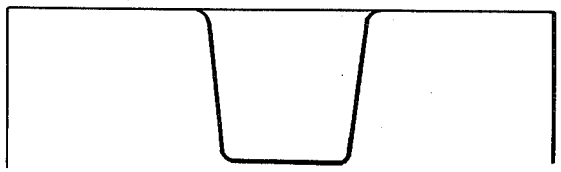

PLANAR MAGNETRON SPUTTERING METHOD AND APPARATUS

BACKGROUND OF THE INVENTION

This invention relates to sputtering apparatus and more particularly to improvements in planar cathode sputtering devices.

Sputtering is a well known method of providing relatively uniform deposits of material on a substrate. Essentially, sputtering is accomplished by the impingement of gas ions on a cathode plate or target plate in the presence of an electrostatic field which causes particles of the cathode plate material to be dislodged therefrom. By appropriately positioning a substrate in the path of such dislodged particles, a deposit of cathodic material will be produced on the substrate. While sputtering enables relatively uniform deposition on a substrate, the rate of deposition has been severely limited. Consequently, sputtering techniques have been limited to those applications wherein thin films, on the order of several micrometers, are to be deposited on a substrate.

Recently, increased sputtering rates have been achieved by confining the glow discharge plasma, in which the gas ions are produced, in close proximity to the target plate, such that ionization of the gas will occur more frequently. In this manner, an increased rate of ion impingement upon a target plate, and hence greater sputtering activity, is enabled. More specifically, a magnetic field is provided such that flux lines extend from and return in an arched or curved path to the surface of a target plate thereby forming a virtual "tunnel". By providing the aforementioned magnetic field in a closed loop or "racetrack" configuration, electrons will tend to be swept about this loop under the influence of the applied magnetic field and electric field. It is the resulting plasma confinement which promotes a high degree of ionization of molecules of the ambient gas, e.g. argon. The ions are electrostatically attracted to the target plate and thus effectively stimulate a high degree of sputtering activity and correspondingly high deposition rates of cathodic, or sputtered, material on a substrate. Typical of the aforedescribed sputtering apparatus is the device illustrated in U.S. application Ser. No. 438,482, filed on Jan. 31, 1974, in the name of John S. Chapin.

It has been found that material sputtered from a target plate subjected to the aforedescribed magnetic field is dislodged primarily from an erosion region underlying the curved flux lines. In addition, it has been found that a region or location exists at which such flux lines are parallel to the cathode. This, in turn has resulted in maximum target erosion at a region substantially aligned with and underlying the foregoing point or area over which magnetic flux lines are parallel to the target plate. When a complete target plate area is considered, it has been found that a line defining the nadir of a deep "valley" exists in the cathode plate approximately centrally of the aforementioned closed magnetic loop. Accordingly, deep and acute erosion of a cathode plate will readily extend completely therethrough and although a major portion of the target plate remains available as a source of sputtering material, the sputtering rate will decrease due to the absence of target material underlying the location of parallel magnetic flux lines. Tests have shown that under the foregoing circumstances, only approximately 38% by weight of the target plate is actually realized as sputtered material. Accordingly, a clear need exists for methods and apparatus capable of increasing the amount of material which may be sputtered from a planar cathode before the target plate must be replaced, particularly in view of the ever increasing costs of commonly sputtered materials such as copper, palladium, titanium, chromium, etc.

OBJECTS OF THE INVENTION

It is an object of the present invention to provide a sputtering apparatus of the planar magnetron type wherein a greater portion of the cathode plate material is exploited as a sputtering source than previously attainable.

SUMMARY

In accordance with the present invention, a sputtering apparatus is comprised of a planar sputtering source, anode means spaced from said source for establishing an electrostatic field therebetween, first magnet means for providing flux lines exiting said source and returning thereto along a curved path thereby defining an erosion region in a generally closed loop configuration on said source surface and second magnet means for producing a variable magnetic field in a direction substantially normal to said source such that the location at which resultant flux lines are parallel to the cathode plate is varied whereby a relatively uniform cathode erosion pattern substantially throughout said erosion region is established.

BRIEF DESCRIPTION OF THE DRAWING

The invention will be more clearly understood by reference to the following detailed description of an exemplary embodiment thereof in conjunction with the following drawing in which:

FIG. 2 is a sectional plan view of an exemplary embodiment of sputtering apparatus in accordance with the invention;

FIG. 3 is a diagrammatic view of a target plate and typical cathode erosion patterns developed upon operation of prior art sputtering devices; and FIG. 4 is a diagrammatic view of a target plate and the improved cathode erosion pattern attainable upon operation of the exemplary sputtering apparatus of the present invention.

DESCRIPTION OF THE PREFERRED EMBODIMENT

Figure 1:
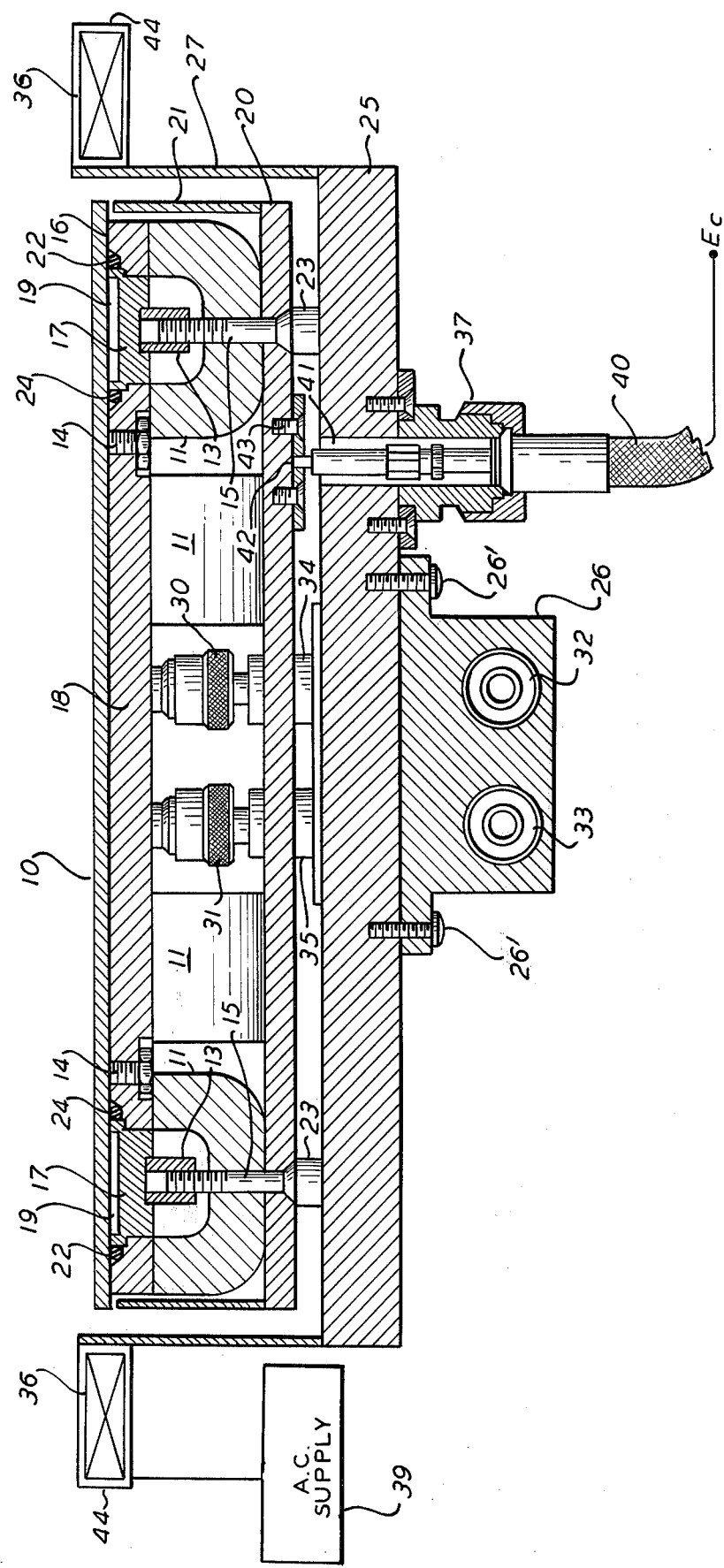
FIG. 1 is a sectional elevational view of an exemplary embodiment of the sputtering apparatus in accordance with the present invention.

Referring now to FIG. 1, illustrated therein is an exemplary embodiment of sputtering apparatus in accordance with the invention generally comprising a sputtering source in the form of target plate or source 10, magnet means 11, cathode pole pieces 16–18, cathode cooling means 30–35, coil 36 and appropriate electrical power supply and connector means. Target plate 10, which forms a source of material such as copper, titanium, etc. to be sputtered onto a substrate (not shown), is preferably substantially planar and may, for example, be of a rectangular configuration. Magnet means 11 is illustrated as comprised of a plurality of U-shaped permanent magnets each of which is provided with a central aperture adapted to receive a screw 15 journalled therethrough as will be subsequently described. Preferably, each of magnet means 11 are aligned in an array that generally outlines a closed loop configuration. Although six permanent magnets are utilized in this exemplary embodiment (two side magnets not being shown in the sectional elevational view of FIG. 1), it will be understood that any suitable number of magnets may be utilized and not necessarily in a substantially oval configuration. For example, magnet means 11 may be disposed such that substantially circular or rectangular magnetic closed loop paths are established as desired. Furthermore, although permanent magnets are illustrated as comprising magnet means 11, it will be recognized that suitable electromagnets may be utilized in lieu of permanent magnets as illustrated in the aforesaid Chapin application.

A cathode pole piece assembly will now be described additionally with reference to FIG. 2 wherein a sputtering apparatus in accordance with the invention is depicted with target plate 10 removed. Pole piece 16 is preferably comprised of a magnetic material such as hot rolled, mild steel and is generally configured to conform to the geometry of the closed magnetic loop established by the particular desired array of magnet means 11. Thus, as illustrated in FIG. 2, pole piece 16 is formed in a substantially oval configuration juxtaposed with each outer leg of magnet means 11. Pole piece 18 may, for example, take the form of a flat elongated plate and is adapted to extend over the inner legs of each of magnet means. Member 17, which is configured in a form similar to that of pole piece 16, is of a non-magnetic material such as stainless steel and is efffective to preclude a shunting of magnetic flux lines between pole pieces 16 and 18 in order to establish such lines of flux in a curved or arched manner out of and returning into target plate 10. A coolant passage 19 having an inlet 28 and an outlet 29 is formed in member 17 to enable a coolant flow therethrough for cooling target plate 10. Suitable sealing means in the form of O-rings 22 and 24 are provided in known manner to assure confinement of a coolant such as water in passage 19 as will be apparent upon reference to FIG. 1.

Continuing with the description of apparatus illustrated in FIG. 2, anode 12 is disposed substantially parallel to one side of pole piece 16 and target plate 10 (FIG. 1). The particular shape of the anode 12 is not critical. It may be substantially linear and comprised of an electrically conductive material such as copper. Additionally, anode 12 is electrically connected to one side of a suitable power supply $E_c$. The power supply $E_c$ may be either a d.c. or an a.c. supply, depending upon whether the target is a conductor or an insulator. A coil 36 is disposed exteriorly of a cathode shield 21 and dark space shield 27 all of which are preferably provided with an external jacket of a non-magnetic material such as stainless steel. Coil 36 is connected to an a.c. power supply 39 (FIG. 1) and in response to the application of such a potential to coil 36 an alternating electromagnetic field will be generated substantially normal to the plane of target plate 10.

Referring again to FIG. 1, a cathode mounting plate 20 is provided to support magnet means 11, target plate 10 and the cathode pole piece assembly 16–18. Plate 20 is provided with apertures for receiving screws 15 which extend through magnet means 11 and threadably engages a stud 13 which is brazed or otherwise rigidly secured to member 17 of the cathode pole piece assembly. As cathode plate 10 is secured by means of, for example, screws 14 to pole piece 18 which is brazed or otherwise secured to member 17, tightening of screws 15 will firmly mount target plate 10 on plate 20. Cathode shield 21 extends substantially vertically from the periphery of mounting plate 20 and provides a degree of electrostatic shielding as will be described hereinafter.

A base plate 25 is provided for supporting target plate 10, magnet means 11, etc. and for receiving cooling and electrical connecting elements as will be subsequently described. Insulating spacer elements 23 are appropriately disposed for spacing plates 25 and 20 as the latter is maintained at a high negative potential, e.g. 900v while the former is held at ground level. A dark space shield 27, which may comprise a vertically upwardly extending member formed of stainless steel is disposed in substantially surrounding relationship to cathode plate 10. As those skilled in the art will appreciate, any electrons scattered into the space between shields 21 and 27 will be repelled from shield 21 (at cathode potential) toward shield 27 (at ground). As such electrons are generally scattered at low energy levels, e.g. 5–10e.v., ionization of gas in the dark space is substantially precluded thus severely restricting sputtering except from the exposed upper surface of the target plate 10.

In order to provide the requisite cooling of target plate 10, a suitable coolant such as water is supplied through a cooling assembly 30–35 to channel 19 in member 17 (FIG. 2). The cooling assembly includes inlet and outlet insulated cooling conduits 32 and 33 secured to mounting block 26 which in turn is affixed to base plate 25 by means of screws 26'. Conduits 32 and 33 extend through shields 34 and 35 to connecting elements 30 and 31, respectively, thereby enabling the supply of a cooling fluid to inlet 28 and discharge from outlet 29 (FIG. 2). Shields 34 and 35, which are spaced from plate 20, are preferably comprised of a material such as stainless steel and act to prevent deposition of sputtered material on conduits 32 and 33.

An insulated electrical power line 40, which may be a coaxial cable, is connected to the other side of the power supply $E_c$. Power line 40 terminates in a conventional connecting element 37 and extends through an aperture 41 in base plate 13. The central conductor 42 of power line 40 is secured to receiving means 43 rigidly secured to mounting plate 20. Accordingly, a cathode potential sufficient to cause sputtering to occur is supplied through conductor 40, mounting plate 20, screws 15, studs 13, member 17, and pole pieces 16 and 18 to target plate 10.

Further, in accordance with the present invention, a coil 36 which is electrically coupled to a.c. supply 39 is preferably disposed in a surrounding relationship to target 10 and is approximately located in the plane thereof. Coil 36 may be hermetically sealed within a suitable enclosure 44 rigidly secured to dark space shield 27.

Prior to describing the operation of the exemplary sputtering apparatus illustrated in FIGS. 1 and 2, reference is made to FIG. 3 which illustrates the magnetic flux H and cathode erosion patterns characteristic of prior art devices. As noted previously, the location above target plate 10 at which flux lines are generally parallel thereto corresponds to the location in target plate 10 of maximum erosion with substantially less cathode erosion occurring, during sputtering, from other portions thereof as illustrated in FIG. 3.

In operation of the improved sputtering apparatus according to the present invention, target plate 10 and anode 12 are energized with the aforementioned potential. Consequently, electrons will be swept around a closed loop (above cathode plate 10) corresponding to the closed loop magnetic field established by magnet means 11 as previously described. In addition, coil 36 is energized with a suitable a.c. voltage to produce a magnetic field substantially normal to the plane of cathode 10 as illustrated by arrows $H_o$ in FIG. 4. Magnetic field $H_o$ will combine vectorially with the flux (depicted in FIG. 3) generated by magnet means 11 and will produce a resultant magnetic field $H_r$ having a point or region at which flux lines are generally parallel to the surface of cathode plate 10. By applying an a.c. voltage to coil 36, the point or location at which resultant flux lines are parallel to the surface plate 10 will move from one side of cathode plate 10 to the other at a rate corresponding to the frequency of a.c. supply 39 which, for example, may be on the order of 1.0 $H_z$. Due to translation of the location of parallel resultant flux lines, the corresponding underlying point or location of maximum cathode erosion will no longer remain stationary but will similarly vary across cathode plate 10 resulting in an erosion pattern as typically illustrated in FIG. 4. In this manner, a greater portion of cathode plate 10, say up to 50 to 60% thereof, is both available and realizable as a sputtering source. Hence, the useful life from any particular target plate is increased by sputtering in accordance with the teachings of the present invention.

A further beneficial effect of providing an auxiliary magnetic field substantially normal to cathode plate 10 resides in the tendency of electrons dislodged from plate 10 being subjected to an electromagnetic force generated by such an auxiliary field. More particularly, the electromagnetic force acting on electrons scattered from peripheral portions of cathode plate 10 tends to return electrons to the region overlying the cathode. Accordingly such scattered electrons are available for subsequent ionization of the ambient gas, which as aforesaid, will enhance the rate at which material is sputtered from plate 10 onto a substrate.

It will be understood by those skilled in sputtering technology that the aforedescribed improved apparatus is operated in a vacuum chamber which is initially evacuated to a pressure of approximately $10^{-5}$ torr. Subsequently, the chamber is back-filled with an ionizable gas such as argon to a pressure of approximately $2.0 \times 10^{-3}$ to $2.0 \times 10^{-2}$ torr prior to energization of cathode plate 10, anode 12 or coil 36.

While the present invention has been particularly described in terms of specific embodiments thereof, it will be understood that numerous variations upon the invention are now enabled to those skilled in the art, which variations are yet within the instant teachings. Accordingly, the present invention is to be broadly construed and limited only by the scope and the spirit of the claims now appended hereto.

What is claimed is:

1. A method of increasing the amount of material which can be sputtered from the target plate of a planar magnetron cathode wherein a glow discharge plasma is magnetically confined to an annular region adjacent to the target plate, comprising:

magnetically shifting a portion of the glow discharge plasma in a direction parallel to the target plate.

2. A method of increasing the extent of the erosion region of a sputtering source in a sputtering apparatus wherein a glow discharge plasma is magnetically confined to a closed loop region adjacent to the source by lines of magnetic flux which emerge from the source and return thereto along a curved path, comprising:

magnetically shifting a portion of the glow discharge plasma across the target plate.

3. Apparatus for sputtering increased amounts of material from a planar sputtering source comprising anode means spaced from said source for establishing an electrostatic field therebetween, first magnet means for providing flux lines exiting said source and returning thereto along a curved path thereby defining an erosion region on said source in a closed loop configuration, second magnet means adapted to produce an auxiliary, variable magnetic field in a direction substantially normal to said source in the presence of said flux lines such that upon variation of said variable magnetic field, the location at which resultant flux lines are generally parallel to said source is continuously translated across said erosion region whereby said source is eroded to a generally uniform depth substantially throughout said erosion region.

4. Apparatus as defined in claim 3 wherein said second magnet means comprise an electromagnetic coil disposed in a surrounding relationship with respect to said source and substantially co-planar therewith.

5. Apparatus as defined in claim 4 wherein said second magnet means includes means for supplying an a.c. potential to said coil such that said variable magnetic field is generated.

6. Apparatus as defined in claim 3 wherein said first magnet means comprise a plurality of permanent magnets spaced in a closed loop array.

7. Apparatus as defined in claim 6 additionally comprising means for cooling said source upon energization of said source, anode means and said second magnet means.

8. An improved cathode sputtering device of the type including a flat target plate on which an annular erosion region is formed, and a first magnetic means for confining a glow discharge plasma to an annular region adjacent to the target plate by producing lines of magnetic flux which emerge from the target plate, arc into the glow discharge region in which there are points at which the magnetic field is parallel to the target plate, and re-enter the target plate, the improvement comprising:

a second magnetic means for producing a variable magnetic field which enables the points in the glow discharge region at which the lines of flux are parallel to the target plate to be translated across the target plate whereby the extent of the annular erosion region is increased.

9. The cathode sputtering device of claim 8 wherein the second magnetic means comprises a coil which encircles the target plate and which can be energized to produce an electromagnet.

10. In a cathode sputtering device of the type including a sputtering source on which a closed loop erosion region is formed, and first magnetic means for confining a glow discharge plasma to a closed loop region adjacent to the sputtering source by producing lines of magnetic flux which emerge from the sputtering source and return thereto along a curved path, the improvement comprising:

second magnetic means for producing a variable magnetic field which enables the curved path portions of the lines of magnetic flux to be translated across the sputtering source whereby the extent of the closed loop erosion region is increased.

* * * * *